United States Patent [19]

Snedkerud et al.

[11] 4,228,541
[45] Oct. 14, 1980

[54] DEVICE FOR THE ELECTRO-OPTICAL DISPLAY OF THE TUNING OF A TELEVISION AND/OR SOUND RADIO RECEIVER

[75] Inventors: Ole Snedkerud, Windisch; Peter J. Wild, Wettingen, both of Switzerland

[73] Assignee: BBC Brown Boveri & Company Limited, Baden, Switzerland

[21] Appl. No.: 941,076

[22] Filed: Sep. 11, 1978

[30] Foreign Application Priority Data

Sep. 13, 1977 [CH] Switzerland .................. 11145/77

[51] Int. Cl.² .............................................. H04B 1/26
[52] U.S. Cl. .................................................. 455/158
[58] Field of Search ............... 325/452, 455, 464, 468, 325/398; 334/86; 340/802, 756, 799

[56] References Cited

U.S. PATENT DOCUMENTS

| | | | |
|---|---|---|---|
| 4,048,562 | 9/1977 | Haselwood et al. | 325/455 |
| 4,063,178 | 12/1977 | Tanaka | 325/464 |
| 4,075,567 | 2/1978 | Klank et al. | 325/464 |
| 4,122,395 | 10/1978 | Schotz et al. | 325/455 |

Primary Examiner—Marc E. Bookbinder
Attorney, Agent, or Firm—Oblon, Fisher, Spivak, McClelland & Maier

[57] ABSTRACT

A device for the electro-optical display of the tuning of an electromagnetic wave receiver, such as a television or a radio, wherein the frequency of a received electromagnetic signal is measured and converted into a digital representation, which is applied to the input of a memory as the address of the various preprogrammed names of selected transmitting stations. The output of the memory is applied to select appropriate display elements of an electro-optical display and the selected display elements are then excited to provide a display indicative of the name or call letters of the transmitter station corresponding to the tuned receiver signal.

11 Claims, 4 Drawing Figures

DEVICE FOR THE ELECTRO-OPTICAL DISPLAY OF THE TUNING OF A TELEVISION AND/OR SOUND RADIO RECEIVER

BACKGROUND OF THE INVENTION

1. Field of the Invention:

The present invention relates to a device for the electro-optical display of the tuning of a television and/or sound radio receiver, and more particularly to such a device having a circuit for directly or indirectly measuring the tuned frequency received, and to an electro-optical display instrument.

2. Discussion of the Prior Art:

When tuning a television and/or sound radio receiver to a particular transmitter, the resonant frequency of at least the input circuit of the receiver is adjusted to the frequency of this transmitter. This can be accomplished directly by mechanically rotating or displacing parts of a tuning capacitor or of an inductor, or indirectly by changing the control voltage on an electrically controlled tuning element. For an optical display of the tuning of the receiver, it is customary to transfer the rotation or displacement of the capacitor or inductor, or of the voltage source for the tuning element in the input circuit, by means of a mechanical coupling mechanism to a pointer which is located, rotatably or displaceably, in front of or behind a graduated or inscribed scale.

This customary display device has several disadvantages. The synchronization between the rotation or displacement of the tuning device or the voltage source and that of the pointer is inaccurate, and this is found to be troublesome, particularly in the case of high frequencies. For this reason, it is virtually impossible, even with very precise display devices of this type, to tune accurately to a transmitter solely with the aid of the frequencies or wavelengths plotted on the graduated scale. Moreover, because of the frequency-dependent "spacing" of the transmitters, it is not possible to distribute the names of the transmitters uniformly on the surface of the scale and, for this reason, the names of transmitters indicated on the scale usually coincide only partially with the transmitters which can in fact be received. Finally, these display devices with their multiplicity of mechanically moving parts are relatively involved and correspondingly expensive and require much space, which is inapposite to the electronics of the receiver, which is increasingly miniaturized and constructed without moving parts.

Various electronic display devices, by means of which the disadvantages described are to be overcome, have therefore already been disclosed.

In a first known display device (Funk-Technik, 1971, No. 5, page 157 et seq.), the frequency received is displayed by means of digital display elements. For this purpose, the oscillations of the heterodyne oscillator, the frequency of which is in a defined ratio to the resonant frequency of the input circuit, are converted to pulses, the pulse frequency is stepped down and the pulses are then passed periodically to a counter during a preset period of time. With an appropriately corrected counter, the number of the pulse counted can be displayed directly as the frequency received.

In another known display device (DT-OS 2,435,088), the tuned frequency received is displayed in a quasi-analog manner with the aid of display elements arranged in the form of a band. To operate this device, the control voltage for an electrically controlled tuning element is converted in an analog digital converter into a pulse train, the pulse frequency is counted and the signals appearing at the output of the counter are passed to a decoder, the outputs of which are each connected to one of the display elements arranged in the form of a band and which excites a display element corresponding to the counted pulse frequency.

These two known electro-optical display devices have no mechanically moving parts and at least the first-mentioned device makes it possible to display the tuned frequency received very accurately. Both devices have, however, the disadvantage that they only display the tuned frequency received, and therefore it is not possible to see whether this tuned frequency corresponds to a desired transmitter station or to a transmitter station name. In the first-mentioned device, in order to associate the display frequency to a transmitter, it is necessary to use an additional conversion table or chart. The second quasi-analog display device can be combined with a scale of the type hitherto customary, but even then, at least the problem of distributing the station names on the surface of the scale remains.

SUMMARY OF THE INVENTION

Accordingly, it is one object of the present invention to provide an electro-optical display device which displays the name of a transmitter transmitting electromagnetic waves which are received by a tuned receiver.

According to the invention, this and other objects are achieved by a display device which is characterized by a memory, the input of which is connected at least to the output of a first circuit arrangement and the output of which is connected to a second circuit arrangement provided for the excitation of the electro-optical display devices. The memory comprises a plurality of memory blocks, each of which stores the name of one transmitter. The invention is further characterized in that the output signal of the first circuit arrangement is used as the address of a memory block and the contents of the addressed memory block are transmitted, for the electro-optical display, to the input of the second circuit arrangement.

Like the electro-optical display devices already mentioned, the new display device has no mechanically moving parts. The electronic components used require little space, do not need individual readjustment and are in part commercially available or can be manufactured cheaply in large numbers. Since only the name of one particular tuned transmitter appears on the display surface, the display is readily legible even in the case of a relatively small display surface and from a relatively large distance. If the memory blocks are suitably addressed, it is possible unambiguously to display even those transmitters having frequencies separated by the permissible minimum spacing. Finally, the manner of forming the address also makes it possible for the name of the tuned transmitter only to be displayed when tuning is at the optimum.

In a preferred embodiment of the new display device, an activating circuit is provided, which is coupled to the input circuit or to an intermediate frequency circuit of the receiver and which activates the display device only if the signal received exceeds a minimum value which can be set on a voltage source. This activating circuit has the result that only those transmitters are displayed, whose received picture and/or sound signals are received without interference.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
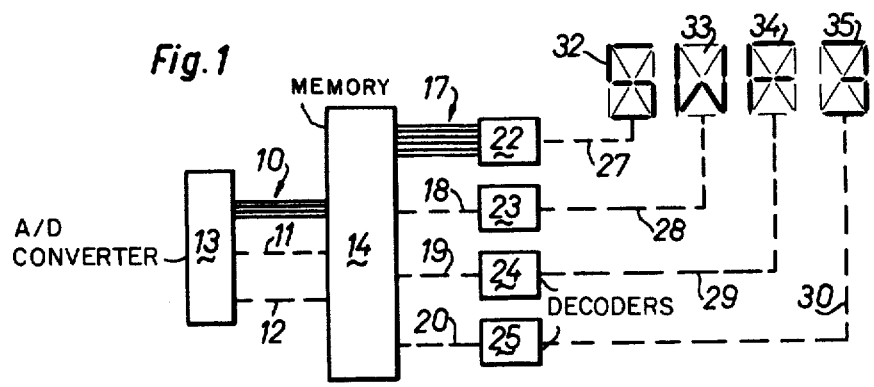
FIG. 1 is a block diagram of a first embodiment of the new display device according to the invention.

Referring now to the drawings, wherein like reference numerals designate identical or corresponding parts throughout the several views, the invention is now described. It is noted, however, that the processing of the signals required for the display device, in particular the de-coupling of oscillations from a FM and/or AM oscillator, the amplification of these oscillators an their conversion to rectangular pulses, as well as the sub-division of the pulse frequency and the periodic counting of the pulses during preset short periods of time, is known and extensively described, for example in DT-AS 2,358,673 and in the already mentioned publication in the journal "Funk-Technik". The processing of a direct voltage, corresponding to the setting of a tuning element, into digital signals and, in particular, into a number consisting of several digits, is likewise known and described, for example in the quoted DT-OS 2,435,088; for this reason, these parts of signal processing in a first circuit arrangement are omitted in the following text.

It is also possible, however, to utilize the oscillations, which are to be counted, directly from the heterodyne oscillator. Since it is not necessary to display any transmitter frequency or station frequency, but since a defined oscillator frequency corresponds to each transmitter or to each station, it is possible, by means of a customary frequency counter even without using an intermediate frequency mis-matching circuit of the type described in DT-AS 2,358,673, to effect a "direct" control from the heterodyne oscillator, which control, however, is called an indirect measurement in the following text.

Moreover, to simplify the figures and the description which follows, it is assumed that the names or characteristics of the transmitters to be displayed have, for simplicity's sake, only four alpha-numerical characters.

The first embodiment of the new display device, shown in FIG. 1, comprises several conductor bundles 10, 11, 12 which lead from the output of a counter or analog/digital converter 13 to the input of a memory 14. Each conductor bundle is intended to transmit a numeral in BCD code and has four conductors for this purpose. Four conductor bundles 17, 18, 19, 20 lead in each case from the memory output to one segment decoder 22, 23, 24 or 25 respectively. Each conductor bundle is intended to pass on a letter or character in ASCII code and contains the six conductors required for this purpose. The output of each segment decoder is connected via a connector bundle 27, 28, 29, 30 to an associated electro-optical display element 32, 33, 34 and 35 respectively. In the embodiment shown, each display element has fourteen display segments which can be triggered individually, and for this reason each of the last-mentioned conductor bundles also has fourteen conductors.

To describe the mode of operation of this display, let us assume that, at the output of the counter or analog/digital converter 13, there is a three-digit number which corresponds to the numerals in the three highest decimal places of the frequency of the transmitter known under the sign of SWF3 of which is allocated to the frequency of this transmitter. An "allocated frequency" is, for example, the oscillator frequency of the receiver. This sequence of numerals is passed via the lines 10, 11, 12 to the input of the memory 14 and serves as the address for a memory block in which the characters S, W, F and 3 are stored. As soon as the memory block has been addressed, the data items corresponding to these characters appear at the output of the memory, and each of the items is then passed via one of the lines 17, 18, 19 and 20 to a segment decoder 22, 23, 24 and 25 respectively. By means of a suitable circuit, the segment decoder then connects the display segments, required for the optical representation of the particular character, via the corresponding conductors in the associated conductor bundle.

It is to be understood that, in the example shown, the conductor bundles 11 and 12, drawn in dashes in a simple manner, and the conductor bundles 18, 19 and 20, drawn in the same way, likewise each have four or six individual conductors respectively.

Figure 2:
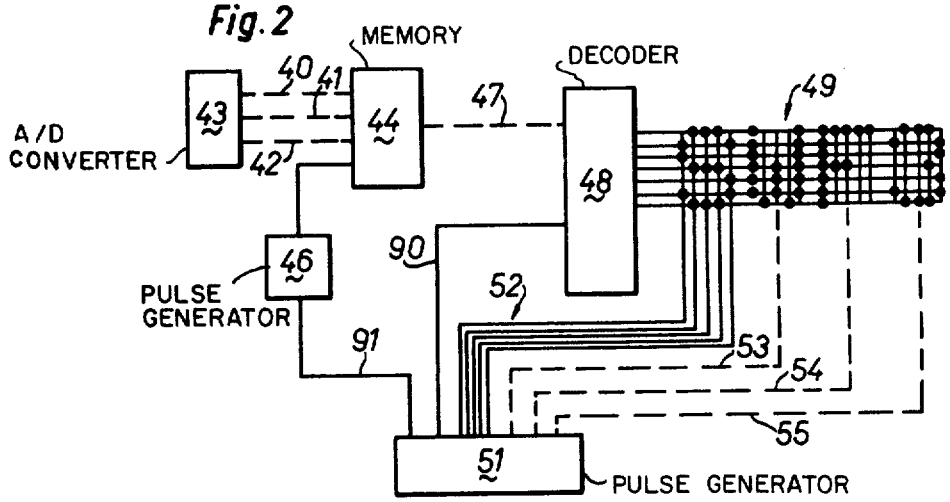
FIG. 2 is a block diagram of a second embodiment of the new display device.

The embodiment of the new display device, shown in FIG. 2, likewise comprises three conductor bundles 40, 41, 42 which connect the output of a counter or analog digital converter 43 to the input of a memory 44. Moreover, a first pulse generator 46 is provided, the output of which is likewise connected to the input of the memory. The output of the memory is connected by means of a conductor bundle 47 to an input of a decoder 48. The rows of a seven-row display matrix 49 are connected to the output of this decoder. The device also comprises a second pulse generator 51, to the outpt of which the same number of conductors is connected as the number of columns contained in the display matrix 49. In the example shown, these conductors are combined into four conductor bundles 52, 53, 54 and 55, each of which leads to one column of the display matrix 49. Moreover, two lines 90, 91 lead from the output of the second pulse generator 51 to the decoder 48 and to the first pulse generator 46 respectively.

In FIG. 2 also, for the sake of a clear representation, the individual conductors of the conductor bundles 40, 41, 42 (which correspond to the conductor bundles 10, 11 and 12 in FIG. 1) drawn in dashes are, like those of the conductor bundle 47 (which corresponds to the conductor bundle 17 in FIG. 1) and the conductors of the bundles 53, 54 and 55 (which correspond to those of the conductors bundle 52), not drawn individually.

To describe the mode of operation of this embodiment, let us assume again that, at the output of the counter or analog/digital converter, there is a sequence of digits, which corresponds to the highest decimal places of the frequency of the tuned transmitter. Each of the coded digits is passed via one of the conductor bundles 40, 41, 42 to the input of the memory 44 where the number, consisting of the digits, is used as the address for a memory block in which the sequence of characters for the name of the transmitter allocated to this frequency is stored. The pulses passed from the pulse generator 46 to the memory are used as timing pulses which determine the succession in time when the characters are read out. The characters are here read out in an uninterrupted sequence, that is to say after the last character has been read out, the first character reappears, and so on, as long as the same memory block is addressed. The characters, which are coded, for example, in the ASCII code, are passed from the memory output via the conductor bundle 47 to the decoder 48 which decodes each coded character into the same number of data items as the number of columns provided in the display matrix 49 for representing a character. The number of bits forming each data item corresponds to the number of rows provided in the display matrix 49. In the example shown, each character read out of the memory is decoded into five data items, each of which consists of seven bits. The pulses of the pulse train generated by the second pulse generator 51 appear successively on adjacent conductors of the conductor bundles 52, 53, 54 and 55, and the pulse which follows the pulse on the last conductor of the conductor bundle 55, appears again on the first conductor of the conductor bundle 52. Simultaneously, the pulse train of the second pulse generator 51 is passed via the line 90 to the decoder 48 in order to scan the corresponding column data items and to cause them to appear at the decoder output. In this manner, display elements, connected at the crossing points of the rows and columns, can be excited in such a rapid sequence that a static, clearly visible letter sequence or character sequence is formed for an observer.

It is to be understood that, for the mode of operation described, the pulse train frequencies of the two pulse generators 46 and 51 must be matched. The synchronization line 91 serves this purpose. If, for example, the transmitter name SWF3, consisting of four characters, is to be triggered once every 1/50 second, in order to ensure a flicker-free display, each individual character must be triggered within 1/200 second, and 1/1000 second is available in each case for the display elements at the crossing points of the rows and columns to light up. In accordance with this simplified deduction, the first pulse generator 46 would have to be set to a frequency of 200 pulses/second and the pulse generator 51 would have to be set to a frequency of 1000 pulses/second.

The embodiment of the new display device, shown in FIG. 3, again comprises three conductor bundles 60, 61, 62 which connects the output of a counter or analog/digital converter 63 to the input of a memory 64. The output of this memory is directly connected to the rows of a display matrix 66. Moreover, the device comprises a pulse generator 67 which corresponds to the second pulse generator 51 in the embodiment according to FIG. 2. The conductor bundles 68, 69, 70 and 71 are connected to the output of the pulse generator 67, each conductor being connected to a column of the display matrix. The display matrix 67 virtually corresponds to the display matrix 49 shown in FIG. 2 and is therefore not described again.

In this embodiment, 20 data items are stored in each memory block of the memory 64, which data items are suitable for the simultaneous direct excitation of the display elements arranged in a column. When operating this device, the digits passed via the conductor bundle 60, 61, 62 to the memory input are again used as the address for a memory block. The pulses which are generated by the pulse emitter 67 and appear successively on adjacent conductors of the conductor bundles 68, 69, 70 and 71, are all passed successively on the line 92 to the memory 64 and are used as timing pulses for reading out the data items. Simultaneously, one column of the display matrix is excited in each case by one conductor of the groups 68, 69, 70 and 71 so that the display elements located at the crossing points of the display matrix are again excited, in a rapid succession in time, to display the name of a transmitter.

Figure 3:
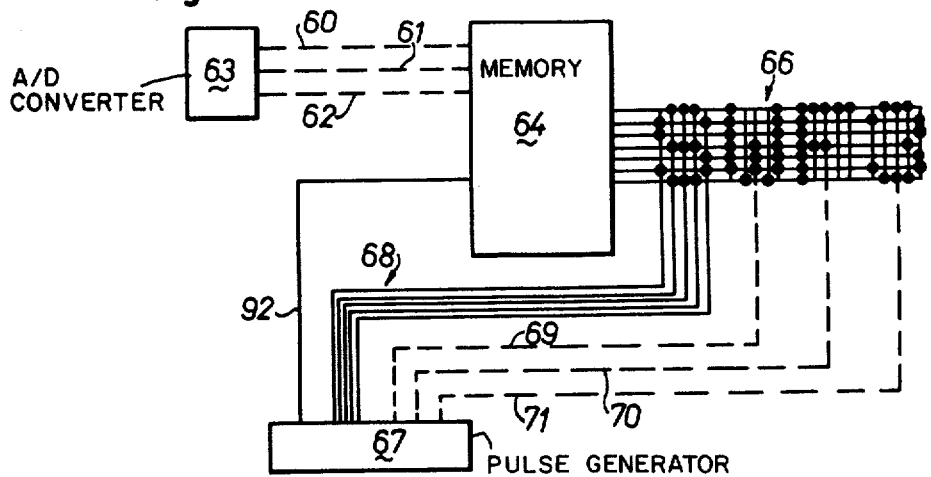
FIG. 3 is a block diagram of a third embodiment of the new display device.

Since in the embodiment according to FIG. 3, it is not the characters of the names of transmitters which are stored but the row signals assigned to each column, an additional decoder (48) is not necessary here, as compared with the embodiment according to FIG. 2; however, a larger capacity of the memory is required instead.

It is to be understood that the illustrative embodiments, which are shown diagrammatically, can be readily reduced to practice. If, for example, the names of transmitters are to be displayed, which have only slightly differing frequencies, it may be necessary for the counter or analog/digital converter to deliver an address which consists of more than three digits. In that case, more than three conductor bundles are of course also necessary in order to pass these digits on to the memory. In practice, the display field will also consist of more than the four display elements shown by way of example, if the names of transmitter stations having a larger number of letters are not to be unduly abbreviated. As the above numerical example shows, the excitation time for the display elements of a column is very short when a display matrix is used, and for this reason, display elements having a defined turn-on voltage for example light-emitting diodes (LED), are preferably used in this embodiment. If, in place thereof, display elements are used, the lighting-up or translucence of which do not have an exactly defined threshold voltage, such as, for example, liquid crystal elements (LC), are used, then it is advisable to sub-divide the display matrix and to use a separate output on the decoder (FIG. 2) or on the memory (FIG. 3) for the rows of each character. This sub-division of the display matrix makes it possible simultaneously to excite a column in each matrix field provided for representing a character and thus correspondingly to prolong the excitation time of the columns.

Commercially available components can be used for the construction of the new display device. The counters and analog/digital converters, pulse generators and segment decoders, which have been mentioned, are well known to those skilled in the art. Permanent memories (ROM, read-only memory) can be used as the memories for all three embodiments described. A decoder which can be used for the device according to FIG. 2, is commercially available under the name Character Generator.

It is also to be understood that, for storing the same number of transmitter names, a memory with a substantially smaller memory capacity is necessary for the embodiment according to FIG. 2 than for the embodiment according to FIG. 3; reference to this fact has already been made above.

In addition to the light-emitting diodes and liquid crystal displays already mentioned, other components can in principle also be used as the display elements, for example incandescent filament lamps, gas discharge paths, electroluminescence layers or electro-chromic displays, so-called EC displays which are described in the journal Funk-Technik July 1977 and also fluorescence-activated displays which are described in the journal Elektroniker May 1977. The selection of the most suitable display element is determined by the available triggering and operating voltages, the triggering and operating characteristics of the elements and the required brightness and colour of the display. This selection is regarded as being within the scope of the ability of those skilled in the art and is therefore not further discussed here.

In the embodiments described above, of the new display device, the displayed transmitter name corresponds to the frequency which the input circuit of the receiver is tuned. It is therefore possible for the name of a transmitter to be displayed even when the latter does not emit any program or when the transmitter output picked up by the receiver is insufficient for a correct picture and/or sound reproduction. In order to overcome this possible disadvantage, a circuit according to FIG. 4 can be used. In this circuit, the tunable input circuit 80 of the receiver is connected to the input of an amplifier 81. A first line 82 leads from the output of this amplifier to the mixer stage of the receiver. Moreover, the amplifier output is also connected to a rectifier 83 which is in series with a low-pass filter which, in a simple manner consists of a resistance 84 and a capacitor 85. A line leads from the low-pass filter to one input of a comparator, the other input of which is connected to an adjustable source 88 of reference voltage. A line 89 leads from the output of the comparator to the display device. The comparator is set in such a way that an activating signal for the display device is emitted into the line 89 only if the signal, derived from the tuning circuit 80 and amplified, is larger than the reference signal from the source 88 of reference voltage.

It will be immediately apparent to those skilled in the art that this circuit can ensure that the display device is activated only if the signal received from a tuned transmitter has sufficient strength to make a picture and/or sound reproduction without interference possible.

In a preferred embodiment of the new display device, the same group of display elements is used for the indication of all the transmitter names stored. Since the display field of the new display device requires only a smaller surface area than the indicator scales which were customary hitherto and which have a mechanically displaced or rotated pointer, relatively large display elements can be used which are still clearly legible even from a distance of a few meters. It is also possible, however, to arrange several groups of display elements in the manner of the scales hitherto customary, and to use each group for displaying only one station name. In a particularly preferred embodiment, the new display device is combined with a quasi-analog display according to the DT-OS 2,435,088 mentioned at the outset and/or with a numerical display of the frequency received, according to the publication in the journal "Funk-Technik" which has likewise already been mentioned. A combined display of this type facilitates tuning to a transmitter since it indicates directly or indirectly whether the receiver set is retuned to higher frequencies or lower frequencies. Finally, it may be pointed out that the new display device can also be used for sets on which transmitters can be preset or selected by pushbuttons, and also for receivers with remote control.

Figure 4:
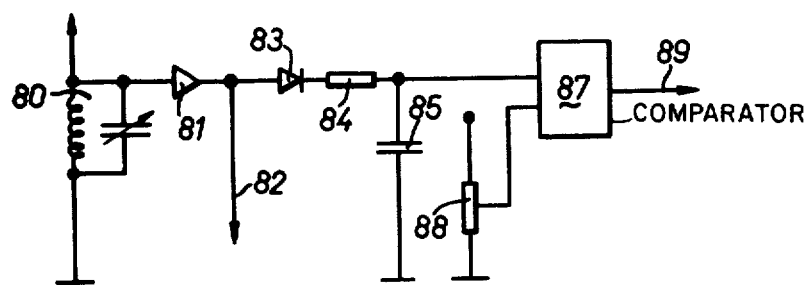
FIG. 4 is a block diagram of a monitoring circuit which activates the display device only if the transmitter output received exceeds an adjustable minimum value.

The output signal for the activating circuit according to FIG. 4 does not necessarily have to be taken from the tunable input circuit, but it can also be taken from one of the intermediate frequency circuits. A signal taken from an intermediate frequency circuit has the advantage of having a greater amplitude and less interference than the signal from the input circuit. It is obvious than an activating circuit, the input signal of which is derived from an intermediate frequency circuit, does not have the line 82 shown in FIG. 4.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A device for the display of the name of a transmitter transmitting electromagnetic waves which are received by a receiver, such as a television or a radio, comprising:
   a first circuit for directly measuring the frequency of incoming electromagnetic waves to which said receiver is tuned;
   an electro-optical display for displaying the name of the transmitter corresponding to the tuned electromagnetic waves received;
   a memory having an input connected to an output of said first circuit, and an output, said memory comprising a plurality of memory blocks, a name of a transmitter being stored in each memory block;
   display excitation means having an input connected to the output of said memory and an output connected to said electro-optical display for producing the excitation of the electro-optical display;
   a second circuit measuring the amplitude of the tuned electromagnetic radiation received and for activating the electro-optical display only in the event that the measured amplitude of the tuned electromagnetic waves received exceeds a predetermined threshold;
   wherein the output signal of the first circuit is used as the address of a memory block and the contents of the addressed memory block are coupled, for control of the electro-optical display, to the input of the display excitation means.

2. A device according to claim 1, wherein the first circuit comprises:
   a counter which generates a coded number which can be used as the address of a memory block.

3. A device according to claim 1, wherein the first circuit comprises:
   an analog/digital converter which generates a coded number which can be used as the address of a memory block.

4. A device according to claim 1, further comprising:
   said memory blocks storing data items corresponding to a sequence of characters of a name of a transmitter; and,
   a pulse generator which interacts with the memory such that the data items of an addressed memory block appear at the output of the memory in a time sequence given by the pulse generator.

5. A device according to claim 4, further comprising:

each stored data item corresponding to a character of the name of a transmitter;

the electro-optical display device having at least one display element for the simultaneous display of a whole character; and, said excitation means including a segment decoder which is connected to the output of the memory and to said at least one display element and which decodes every data item and excites the display segments provided for optically displaying a corresponding character.

6. A device according to claim 4, further comprising:

each stored data item corresponding to a character of the name of a transmitter;

the electro-optical display device comprising a display matrix formed by display rows and columns;

a display row decoder coupled to said memory output; and columns;

a further pulse generator having an output connected to the input of the row decoder and to the columns of the display matrix, the row decoder decoding each data item applied, to its input and corresponding to a character, into a sequence of further data items which correspond to the row signals for the display matrix and which data items appear at the output of the row decoder and on the rows of the display matrix at the same point in time at which the associated column in the display matrix is excited.

7. A device according to claim 4, wherein:

said display comprises a display matrix formed by display rows and columns;

each stored data item corresponding to row signals for the display matrix;

said pulse generator having an output connected to an input of the memory and to the columns of the display matrix, said memory generating row signals appearing at the output thereof and on the rows of the display matrix at the same point in time at which the associated column in the display matrix is excited.

8. A device according to claim 1, wherein the second circuit is coupled to an input circuit of the receiver.

9. A device according to claim 1, wherein the second circuit is coupled to an intermediate frequency circuit of the receiver.

10. A device according to claim 1, wherein the first circuit is coupled to a receiver input tuning circuit for directly measuring the tuned frequency.

11. A device according to claim 1, wherein the first circuit comprises:

a counter which, for indirectly measuring the tuned transmitter frequency, counts the oscillations of a receiver heterodyne oscillator.

* * * * *